United States Patent
He et al.

(10) Patent No.: US 12,507,488 B2
(45) Date of Patent: Dec. 23, 2025

(54) PV MODULE WITH FILM LAYER COMPRISING HYDROPHOBIC-TREATED FUMED SILICA

(71) Applicant: Dow Global Technologies LLC, Midland, MI (US)

(72) Inventors: Chao He, Shanghai (CN); Hong Yang, Shanghai (CN); Weiming Ma, Shanghai (CN); Yunfeng Yang, Shanghai (CN); Yuyan Li, Shanghai (CN); Brian M. Habersberger, Lake Jackson, TX (US); Hongyu Chen, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 624 days.

(21) Appl. No.: 17/599,279

(22) PCT Filed: Mar. 29, 2019

(86) PCT No.: PCT/CN2019/080381
§ 371 (c)(1),
(2) Date: Sep. 28, 2021

(87) PCT Pub. No.: WO2020/198922
PCT Pub. Date: Oct. 8, 2020

(65) Prior Publication Data
US 2022/0216356 A1   Jul. 7, 2022

(51) Int. Cl.
*H01L 31/00* (2006.01)
*C08K 3/36* (2006.01)
*C08K 5/14* (2006.01)
*C08K 5/541* (2006.01)
*C09J 7/00* (2018.01)
*C09J 123/08* (2006.01)
*H10F 19/80* (2025.01)
*H10F 19/85* (2025.01)

(52) U.S. Cl.
CPC ............ *H10F 19/804* (2025.01); *C08K 3/36* (2013.01); *C08K 5/14* (2013.01); *C08K 5/541* (2013.01); *C09J 7/00* (2013.01); *C09J 123/0815* (2013.01); *H10F 19/85* (2025.01)

(58) Field of Classification Search
CPC ......... H01L 31/0481; C08K 3/36; C08K 5/14; C08K 5/541; C09J 123/0815
See application file for complete search history.

(56) References Cited

U.S. PATENT DOCUMENTS 7,902,301 B2   3/2011   Kempe et al.
8,022,130 B2   9/2011   Nowak et al.
(Continued)

FOREIGN PATENT DOCUMENTS

CN   102863914 A   1/2013
CN   102863915 A   1/2013
(Continued)

*Primary Examiner* — Thanh Truc Trinh
(74) *Attorney, Agent, or Firm* — Boyle Fredrickson S.C.

(57) ABSTRACT

A composition for use as a film layer comprises (A) an olefin-based polymer having a volume resistivity greater than $5.0 \times 10^{15}$ ohm·cm; (B) a hydrophobic-treated fumed silica; (C) an alkoxysilane; (D) an organic peroxide; and (E) from 0 wt % to 1.5 wt % of a crosslinking co-agent.

17 Claims, 1 Drawing Sheet

(56) References Cited

U.S. PATENT DOCUMENTS

| | | |
|---|---|---|
| 8,080,727 B2 | 12/2011 | Chou |
| 8,338,528 B2 | 12/2012 | Scholz et al. |
| 8,415,430 B2 | 4/2013 | Kuhn et al. |
| 8,581,094 B2 | 11/2013 | Patel et al. |
| 8,592,679 B2 | 11/2013 | Patel et al. |
| 9,169,340 B2 | 10/2015 | Patel et al. |
| 9,362,436 B2 * | 6/2016 | Nanjundiah ............ H02S 40/34 |
| 9,608,152 B2 | 3/2017 | Yoda et al. |
| 11,282,975 B2 | 3/2022 | Odoi et al. |
| 11,299,613 B2 | 4/2022 | Chaudhary |
| 2008/0078445 A1 | 4/2008 | Patel et al. |
| 2010/0126557 A1 | 5/2010 | Chou |
| 2011/0030791 A1 | 2/2011 | Snowwhite et al. |
| 2013/0233383 A1 | 9/2013 | Naumovitz et al. |
| 2013/0255756 A1 * | 10/2013 | Seo .................... H01L 31/0481 136/251 |
| 2014/0360579 A1 | 12/2014 | Yoda et al. |
| 2015/0013755 A1 * | 1/2015 | Ikenaga .................. C08K 5/00 136/251 |
| 2015/0013768 A1 * | 1/2015 | Odoi ..................... C08F 210/02 136/259 |
| 2015/0287860 A1 | 10/2015 | Tsukada et al. |
| 2017/0101556 A1 * | 4/2017 | Keite-Telgenbüscher ................... C08L 63/00 |
| 2017/0183431 A1 * | 6/2017 | Yoda ........................ C08K 5/14 |
| 2017/0338360 A1 | 11/2017 | Deplace et al. |
| 2020/0062943 A1 | 2/2020 | Chaudhary |

FOREIGN PATENT DOCUMENTS

| | | |
|---|---|---|
| CN | 104241423 A | 12/2014 |
| IN | 102329596 A | 1/2012 |
| JP | 2014-029953 A | 2/2014 |
| JP | 5854473 B2 | 2/2016 |
| KR | 20120057503 A | 6/2012 |
| WO | 2012/133748 A1 | 10/2012 |
| WO | WO 2018/160403 * | 9/2018 ............. C08K 5/521 |

* cited by examiner

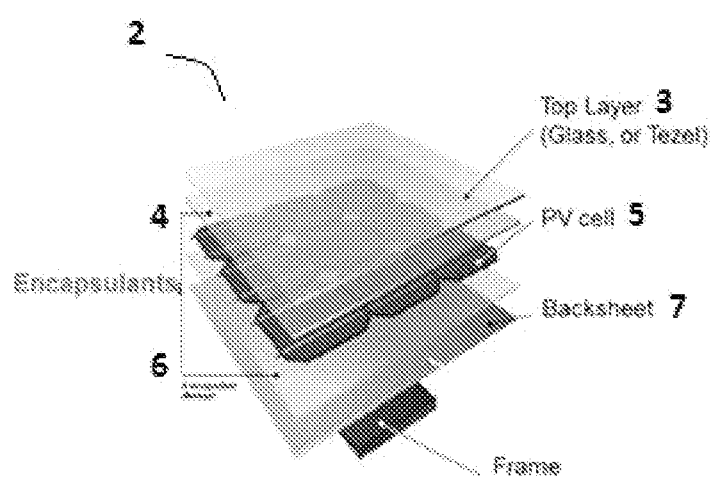

PV MODULE WITH FILM LAYER COMPRISING HYDROPHOBIC-TREATED FUMED SILICA

FIELD

This disclosure relates to olefin-based encapsulant films having improved volume resistivity and electronic devices, such as photovoltaic modules, containing such encapsulant films.

BACKGROUND

The construction of a typical electronic device such as a photovoltaic (PV) module, typically includes a front light transmitting and receiving layer, usually glass, followed by a front encapsulant film layer, the electronic component (e.g., photovoltaic cells), a rear encapsulant film layer and, finally, a rear layer that is a polymeric backsheet or glass. In some instances, the rear encapsulant film layer and the backsheet may be a single film with integrated encapsulant and backsheet functionality, or a back encapsulant composite (BEC) film. Because a PV module is used outside, it must be weather resistant, e.g., protect the electronic components from moisture, shock and vibration and provide electrical resistance. Encapsulant films offer insulation and environmental protection for electrical components used in the electronic device, such as a photovoltaic cell used in a PV module.

Ethylene vinyl acetate (EVA) is currently widely used as an encapsulating material for PV cells due to its transparency, flexibility and ease of conversion into a crosslinkable sheet. However, EVA has poor weather resistant properties and is highly polar, resulting in low volume resistivity (VR). VR is important because it affects the potential induced degradation (PID) resistance performance. Encapsulating solar cells with low-VR encapsulant materials may result in significant module power loss due to PID.

Olefin-based encapsulating materials, such as ethylene/alpha-olefin copolymers, also have excellent transparency, heat resistance and can easily be converted into crosslinkable film. While olefin-based encapsulating materials generally have improved VR in comparison to EVA, olefin-based encapsulating materials have a wide range of VR, with the best PID-preventing performance achieved with olefin-based encapsulating material having a VR greater than $10^{17}$ ohm·cm. Olefin-based encapsulating materials with lower VR would benefit from an improvement in VR.

A need exists for encapsulant films containing an olefin-based resin having improved volume resistivity.

SUMMARY

In accordance with embodiments of the present disclosure, a composition is provided. The composition comprises (A) an olefin-based polymer having a volume resistivity greater than $5.0*10^{15}$ ohm·cm; (B) a hydrophobic-treated fumed silica; (C) an alkoxysilane; (D) an organic peroxide; and (E) from 0 wt % to 1.5 wt % of a crosslinking co-agent.

In accordance with further embodiments of the present disclosure, a film layer is provided. A film layer is made of a composition comprising (A) an olefin-based polymer having a volume resistivity greater than $5.0*10^{15}$ ohm·cm; (B) a hydrophobic-treated fumed silica; (C) an alkoxysilane; (D) an organic peroxide; and (E) from 0 wt % to 1.5 wt % of a crosslinking co-agent, wherein the film layer has a volume resistivity from greater than or equal to $8.0*10^{17}$ ohm·cm to $5.0*10^{18}$ ohm·cm.

In accordance with further embodiments of the present disclosure, a photovoltaic module is provided. The photovoltaic module includes a photovoltaic cell and a film layer composed of a composition which is the reaction product of a composition comprising (A) an olefin-based polymer having a volume resistivity greater than $5.0*10^{15}$ ohm·cm; (B) a hydrophobic-treated fumed silica; (C) an alkoxysilane; (D) an organic peroxide; and (E) from 0 wt % to 1.5 wt % of a crosslinking co-agent, wherein the film layer has a volume resistivity from greater than or equal to $5.0*10^{17}$ ohm·cm to $6.0*10^{18}$ ohm·cm.

BRIEF DESCRIPTION OF THE DRAWINGS

FIG. 1 is an exploded perspective view of photovoltaic module in accordance with an embodiment of the disclosure.

DEFINITIONS

Unless stated to the contrary, implicit from the context, or customary in the art, all parts and percents are based on weight. For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges disclosed herein include all values from, and including, the lower value and the upper value. For ranges containing explicit values (e.g., a range from 1 or 2, or 3 to 5, or 6, or 7) any subrange between any two explicit values is included (e.g., the range 1-7 above includes all subranges 1 to 2; 2 to 6; 5 to 7; 3 to 7; 5 to 6; etc.).

An "alpha-olefin" or α-olefin" is a hydrocarbon molecule, the hydrocarbon molecule comprising (i) only one ethylenic unsaturation, this unsaturation located between the first and second carbon atoms, and (ii) from 2, or 3, or 4 to 5, or 8, or 10, or 20 carbon atoms. Non-limiting examples of α-olefins from which the elastomers are prepared include ethene, propylene, 1-butene, 1-pentene, 1-hexene, 1-octene, 1-dodecene, and mixtures of two or more of these monomers.

A "blend" or "polymer blend" is a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art.

A "composition" or "formulation" is a mixture or blend of two or more components. In the context of a mix or blend of materials from which an article of manufacture is fabricated, the composition includes all the components of the mix, e.g., polymers, catalysts, and any other additives or agents such as cure catalysts, antioxidants, flame retardants, etc.

The terms "comprising," "including," "having" and like terms are not intended to exclude the presence of any additional component, step or procedure, whether or not the same is specifically disclosed. All processes claimed through use of "comprising" may include one or more additional steps, pieces of equipment or component parts, and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or," unless stated otherwise, refers to the listed members individually as well as in any combination.

"Direct contact" is a configuration whereby two components are in physical contact with each other with no intervening layer(s) and/or no intervening material(s) located between a portion of the two contacting components.

An "ethylene/α-olefin copolymer" is an interpolymer that contains a majority amount of polymerized ethylene, based on the weight of the copolymer, and an α-olefin, as the only two monomer types.

An "ethylene/α-olefin interpolymer" is an interpolymer that contains a majority amount of polymerized ethylene, based on the weight of the interpolymer, and at least one α-olefin.

An "ethylene-based interpolymer" is an interpolymer that contains, in polymerized form, a majority amount of ethylene, based on the weight of the interpolymer, and at least one comonomer.

An "ethylene-based polymer" is a polymer that contains more than 50 weight percent polymerized ethylene monomer and, optionally, may contain one comonomer.

The term "film," including when referring to a "film layer" in a thicker article, unless expressly having the thickness specified, includes any thin, flat extruded or cast article having a generally consistent and uniform thickness typically from 25 micrometers to 1.25 millimeters (mm) or more. "Layers" in films can be very thin, as in the cases of nanolayers, or microlayers. As used herein, the term "sheet," unless expressly having the thickness specified, includes any thin, flat extruded or cast article having a generally consistent and uniform thickness greater than a "film."

"Glass" is a hard, brittle, transparent solid, such as that used for windows, bottles, or eyewear, including, but not limited to, pure silicon dioxide ($SiO_2$), soda-lime glass, borosilicate glass, sugar glass, isinglass (Muscovy-glass), photovoltaic glass or aluminum oxynitride.

An "interpolymer" is a polymer prepared by the polymerization of at least two different types of monomers. The generic term interpolymer thus includes copolymers (employed to refer to polymers prepared from two different types of monomers), terpolymers (employed to refer to polymers prepared from three different types of monomers), and polymers prepared from more than three different types of monomers.

"Linear low density polyethylene" ("LLDPE") is an ethylene-based polymer and includes, in polymerized form, a majority weight percent of ethylene based on the total weight of the LLDPE and a $C_3$-$C_{20}$ α-olefin comonomer, or a $C_4$-$C_8$ α-olefin comonomer. LLDPE is characterized by little, if any, long chain branching, in contrast to conventional LDPE.

"Low density polyethylene" ("LDPE") is an ethylene-based polymer and includes, in polymerized form, a majority weight percent of ethylene based on the total weight of the LDPE and optionally a $C_3$-$C_{20}$ α-olefin comonomer, or a $C_4$-$C_8$ α-olefin comonomer. LDPE is branched or heterogeneously branched polyethylene. LDPE has a relatively large number of long chain branches extending from the main polymer backbone. LDPE can be prepared at high pressure using free radical initiators, and typically has a density from 0.915 g/cc to 0.940 g/cc.

An "olefin-based polymer" is a polymer that contains more than 50 percent polymerized olefin monomer (based on total weight of the olefin-based polymer), and optionally, may contain one or more comonomer(s). Non-limiting examples of olefin-based polymers include ethylene-based polymer and propylene-based polymer. The term "olefin-based polymer" and "polyolefin" may be used interchangeably.

"Photovoltaic cell", "PV cell" and like terms mean a structure that contains one or more photovoltaic effect materials of any of several inorganic or organic types. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials. As shown in FIG. 1, PV cells are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. PV cells may be flexible or rigid in nature and include the photovoltaic effect materials and any protective coating surface materials that are applied in their production as well as appropriate wiring and electronic driving circuitry.

"Photovoltaic module", "PV module" and like terms refer to a structure including a PV cell. A PV module may also include a cover sheet, front encapsulant film, rear encapsulant film and backsheet, with the PV cell sandwiched between the front encapsulant film and rear encapsulant film. An exemplary PV module 2 is shown in FIG. 1 and includes a top layer 3, a front encapsulant layer 4, at least one photovoltaic cell 5, typically a plurality of such cells arrayed in a linear or planar pattern, a rear encapsulant layer 6, and a backsheet 7. The front encapsulant layer 4 is in direct contact with both the photovoltaic cell 5 and also partially with the rear encapsulant layer 6. The front encapsulant layer 4 and the rear encapsulant layer 6 wholly surround, or encapsulate, the photovoltaic cell 5. The backsheet 7 can be a monolayer structure or a multilayer structure or glass (making glass/glass PV modules) which protects the back surface of a PV module 2.

A "polymer" is a polymeric compound prepared by polymerizing monomers, whether of the same or a different type. The generic term "polymer" thus embraces the term homopolymer, usually employed to refer to polymers prepared from only one type of monomer, and the term interpolymer.

Test Methods

Density is measured in accordance with ASTM D792, Method B. The result is recorded in grams (g) per cubic centimeter (g/cc or g/cm³).

Flexural modulus (2% secant) is measured in accordance with ASTM D790 and reported in psi.

Glass adhesion: Laminated samples are cut into three specimens of 1 inch in width (cut backsheet and film layers). A 180° peel test is used to measure the glass adhesion strength (maximum glass adhesion strength and average glass adhesion strength from 1 inch to 2 inches of delamination). The test is conducted on an Instron™ 5565 under controlled ambient conditions. At least three specimens are tested to get the average. Results are reported in Newtons per centimeter (N/cm).

Mean Transmittance: The transmittance of compression molded films is determined using a LAMBDA 950 UV/Vis Spectrophotometer (PerkinElmer) equipped with a 150 mm integrating sphere. At least three samples are tested and the average transmittance from 380 nm to 1100 nm is collected. Results are reported in percent.

Melt index (MI) measurement for polyethylene is performed according to ASTM D1238, Condition 190° C./2.16 kilogram (kg) weight, and is reported in grams eluted per 10 minutes (g/10 min).

Melting Crystallization and Glass Transition: Differential Scanning Calorimetry (DSC) can be used to measure the melting, crystallization, and glass transition behavior of a polymer over a wide range of temperature. For example, the TA Instruments Q1000 DSC, equipped with an RCS (refrigerated cooling system) and an autosampler is used to perform this analysis. During testing, a nitrogen purge gas flow of 50 ml/min is used. Each sample is melt pressed into a thin film at about 175° C.; the melted sample is then air-cooled to room temperature (about 25° C.). A 3-10 mg, 6 mm diameter specimen is extracted from the cooled polymer, weighed, placed in a light aluminum pan (ca 50 mg), and crimped shut. Analysis is then performed to determine its thermal properties.

The thermal behavior of the sample is determined by ramping the sample temperature up and down to create a heat flow versus temperature profile. First, the sample is rapidly heated to 180° C. and held isothermal for 3 minutes in order to remove its thermal history. Next, the sample is cooled to −40° C. at a 10° C./minute cooling rate and held isothermal at −40° C. for 3 minutes. The sample is then heated to 180° C. (this is the "second heat" ramp) at a 10° C./minute heating rate. The cooling and second heating curves are recorded. The cool curve is analyzed by setting baseline endpoints from the beginning of crystallization to −20° C. The heat curve is analyzed by setting baseline endpoints from −20° C. to the end of melt. The values determined are extrapolated onset of melting, Tm, and extrapolated onset of crystallization, Tc. Heat of fusion ($H_f$) (in Joules per gram), and the calculated % crystallinity for polyethylene samples using the Equation below:

% Crystallinity=(($H_f$)/292 J/g)×100

The heat of fusion ($H_f$) and the peak melting temperature are reported from the second heat curve. Peak crystallization temperature is determined from the cooling curve.

Melting point, Tm, is determined from the DSC heating curve by first drawing the baseline between the start and end of the melting transition. A tangent line is then drawn to the data on the low temperature side of the melting peak. Where this line intersects the baseline is the extrapolated onset of melting (Tm). This is as described in Bernhard Wunderlich, *The Basis of Thermal Analysis, in Thermal Characterization of Polymeric Materials* 92, 277-278 (Edith A. Turi ed., 2d ed. 1997).

Crystallization temperature, Tc, is determined from a DSC cooling curve as above except the tangent line is drawn on the high temperature side of the crystallization peak. Where this tangent intersects the baseline is the extrapolated onset of crystallization (Tc).

Glass transition temperature, Tg, is determined from the DSC heating curve where half the sample has gained the liquid heat capacity as described in Bernhard Wunderlich, *The Basis of Thermal Analysis, in Thermal Characterization of Polymeric Materials* 92, 278-279 (Edith A. Turi ed., 2d ed. 1997). Baselines are drawn from below and above the glass transition region and extrapolated through the Tg region. The temperature at which the sample heat capacity is half-way between these baselines is the Tg.

Moving Die Rheometer (MDR): The MDR is loaded with approximately 4 grams of each casted film. The MDR is run for 25 minutes at 150° C. The time versus torque curve for each sample is recorded over the given interval. The maximum torque exerted by the MDR during a 25 minute testing interval (MH) is recorded in deci-Newton meters (dNm). The MH typically corresponds to the maximum torque exerted at 25 minutes. The time it takes for the torque to reach x % of MH (t) is recorded in minutes. $t_x$ is a standardized measurement to understand the curing kinetics of each resin. The time to reach 90% of MH ($t_{90}$) is recorded in minutes.

Volume Resistivity: The volume resistivity is determined using a Keithley 6517 B electrometer, combined with the Keithley 8009 test fixture. The Keithley model 8009 test chamber is located inside the forced air oven which is capable of operating at elevated temperatures (maximum temperature 80° C.). The leakage current is recorded from the instrument via software and the following equation is used to calculate the volume resistivity (VR):

$$\rho = \frac{V \times A}{I \times t}$$

wherein ρ is the volume resistivity in ohm·cm, V is the applied voltage in volts, A is the electrode contact area in cm², I is the leakage current in amps recorded after 10 minutes of applied voltage, and t is the thickness of the sample. The thickness of the compression molded film is measured before the test. Five points of the film are measured to get the average thickness, which is used in the calculation. The test is conducted at 1000 volts at room temperature. Two compression molded films are tested and the recorded VR is the average of the two tests. Results are reported in ohm-centimeters (ohm·cm).

DETAILED DESCRIPTION

The present disclosure provides a pelletized polymer composition composed of (A) an olefin-based polymer having a volume resistivity of greater than $5.0*10^{15}$ ohm·cm and (B) a hydrophobic-treated fumed silica. The pellets of the present disclosure are used in forming a composition for an encapsulant film, such as for an electronic device, e.g., photovoltaic module.

The present disclosure further provides a composition composed of (A) an olefin-based polymer having a volume resistivity of greater than $5.0*10^{15}$ ohm·cm, (B) a hydrophobic-treated fumed silica, (C) an alkoxysilane, (D) an organic peroxide, and (E) a crosslinking co-agent. The composition of the present disclosure is used to produce an encapsulant film, such as for an electronic device, e.g., photovoltaic module. In another embodiment, the present disclosure provides a film layer for an electronic device, such as a photovoltaic module.

The present disclosure further provides a film layer for an electronic device, such as a photovoltaic module, composed of a composition comprising (A) an olefin-based polymer having a volume resistivity of greater than $5.0*10^{15}$ ohm·cm, (B) a hydrophobic-treated fumed silica, (C) an alkoxysilane, (D) an organic peroxide, and (E) a crosslinking co-agent.

Olefin-Based Polymer

The olefin-based polymer is any olefin-based homopolymer (in which the olefin is the sole monomer) or olefin-based interpolymer in which the olefin is the primary monomer (that is, the olefin-based interpolymer comprises greater than 50 wt % units derived from the olefin). In embodiments in which the olefin-based polymer is an olefin-based interpolymer, the comonomer is a different $C_{2-20}$ linear, branched or cyclic α-olefin. For purposes of this disclosure, ethylene is an α-olefin. Non-limiting examples of $C_{2-20}$ α-olefins for use as comonomers include ethylene, propene (propylene), 1-butene, 4-methyl-1-pentene, 1-hexene, 1-octene, 1-decene, 1-dodecene, 1-tetradecene, 1-hexadecene, and 1-octadecene.

In an embodiment, the olefin-based polymer is an ethylene-based polymer that is an ethylene/alpha-olefin copolymer. Non-limiting examples of ethylene/alpha-olefin copolymers include copolymers of ethylene and $C_3$-$C_8$ α-olefins, or $C_4$-$C_8$ α-olefins, such as ethylene/propylene copolymers, ethylene/butene copolymers, ethylene/1-hexene copolymers, ethylene/1-octene copolymers, linear low density polyethylene (LLDPE), low density polyethylene (LDPE), and combinations thereof.

The olefin-based polymer, or further the ethylene-based polymer, or further the ethylene/alpha-olefin copolymer may be random or blocky.

In an embodiment, the olefin-based polymer is a random olefin-based polymer, or further a random ethylene-based copolymer, or further a random ethylene/alpha-olefin copolymer.

The olefin-based polymer has a volume resistivity of greater than $5.0*10^{15}$ ohm·cm. In an embodiment, the olefin-based polymer has a volume resistivity from greater than $5.0*10^{15}$ ohm·cm, or greater than $1.0*10^{16}$ ohm·cm, or greater than $2.0*10^{16}$ ohm·cm, or greater than $3.0*10^{16}$ ohm·cm. In an embodiment, the olefin-based polymer has a volume resistivity from greater than $5.0*10^{15}$ ohm·cm, or greater than $1.0*10^{16}$ ohm·cm, or greater than $2.0*10^{16}$ ohm·cm, or greater than $3.0*10^{16}$ ohm·cm to $4.0*10^{16}$ ohm·cm, or $5.0*10^{16}$ ohm·cm, or $7.0*10^{16}$ ohm·cm, or $1.0*10^{17}$ ohm·cm, or $5.0*10^{17}$ ohm·cm, or $1.0*10^{18}$ ohm·cm.

In an embodiment, the olefin-based polymer has a flexural modulus (2% secant) from greater than or equal to 500 psi, or greater than or equal to 750 psi, or greater than or equal to 1000 psi to 2000 psi, or 3000 psi, or 3500 psi, or 4000 psi, or less than 6000 psi, as measured in accordance with ASTM D790.

In an embodiment, the olefin-based polymer has a density from 0.850 g/cc, or 0.855 g/cc, or 0.860 g/cc, or 0.865 g/cc, or 0.880 g/cc to 0.885 g/cc, or 0.890 g/cc, or 0.900 g/cc, or 0.905 g/cc, or 0.910 g/cc, or 0.915 g/cc, or 0.920 g/cc, as measured in accordance with ASTM D792, Method B.

In an embodiment, the olefin-based polymer has a melt index (MI) from 1 g/10 min, or 5 g/10 min, or 8 g/10 min, or 10 g/10 min to 20 g/10 min, or 30 g/10 min, or 35 g/10 min, or 50 g/10 min, or 75 g/10 min, or 100 g/10 min, as measured in accordance with ASTM D1238.

In an embodiment, the olefin-based polymer has a melting point (Tm) from 55° C., or 60° C., or 75° C., or 90° C., or 95° C., or 100° C. to 105° C., or 110° C., as measured using DSC.

In an embodiment, the olefin-based polymer has a glass transition temperature, Tg, from −30° C., or −35° C. to −40° C., or −45° C., or −50° C., or −60° C., as measured using DSC.

In an embodiment, the olefin-based polymer is an ethylene/$C_3$-$C_8$ α-olefin copolymer having one, some, or all of the following properties:

(i) a volume resistivity from greater than $5.0*10^{15}$ ohm·cm, or greater than $1.0*10^{16}$ ohm·cm, or greater than $2.0*10^{16}$ ohm·cm, or greater than $3.0*10^{16}$ ohm·cm to $4.0*10^{16}$ ohm·cm, or $5.0*10^{16}$ ohm·cm, or $7.0*10^{16}$ ohm·cm, or $1.0*10^{17}$ ohm·cm, or $5.0*10^{17}$ ohm·cm, or $1.0*10^{18}$ ohm·cm; and/or (ii) a flexural modulus (2% secant) from greater than or equal to 500 psi, or greater than or equal to 750 psi, or greater than or equal to 1000 psi to 2000 psi, or 3000 psi, or 3500 psi, or 4000 psi, or less than 6000 psi; and/or (iii) a density from 0.850 g/cc, or 0.855 g/cc, or 0.860 g/cc, or 0.865 g/cc, or 0.880 g/cc to 0.885 g/cc, or 0.890 g/cc, or 0.900 g/cc, or 0.905 g/cc, or 0.910 g/cc, or 0.915 g/cc, or 0.920 g/cc; and/or (iv) a melt index (MI) from 1 g/10 min, or 5 g/10 min, or 8 g/10 min, or 10 g/10 min to 20 g/10 min, or 30 g/10 min, or 35 g/10 min, or 50 g/10 min, or 75 g/10 min, or 100 g/10 min; and/or (v) a melting point, Tm, from 55° C., or 60° C., or 75° C., or 90° C., or 95° C., or 100° C. to 105° C., or 110° C.; and/or (vi) a glass transition temperature, Tg, from −30° C., or −35° C. to −40° C., or −45° C., or −50° C., or −60° C.

In an embodiment, the ethylene/$C_3$-$C_8$ α-olefin copolymer has at least one, at least 2, at least 3, at least 4, at least 5, or all 6 properties (i)-(vi).

In an embodiment, the ethylene/$C_3$-$C_8$ α-olefin copolymer has property (i) and at least one other property of properties (ii)-(vii).

In one embodiment, the ethylene/alpha-olefin copolymer is a copolymer of ethylene and a comonomer selected from octene, hexene, butene and propylene. In an embodiment, the ethylene/alpha-olefin copolymer is an ethylene/1-octene copolymer.

Blends of any of the olefin-based polymers described above may also be used, so long as the volume resistivity of the blend is greater than $5.0*10^{15}$ ohm·cm. The olefin-based polymer or blends thereof may be blended or diluted with one or more other polymers to the extent that the olefin-based polymer(s) and other polymer(s) are (i) miscible with one another, (ii) the other polymer(s) have little, if any, impact on the desirable properties of the olefin-based polymer (i.e., optics and low modulus), and (iii) the content of olefin-based polymer(s) constitute greater than 50 wt %, or 60 wt %, or 70 wt %, or 75 wt %, or 80 wt % to 90 wt %, or 95 wt %, or 98 wt %, or 99 wt %, or less than 100 wt % of the blend based on the total weight of the blend.

The olefin-based polymer having a volume resistivity greater than $5.0*10^{15}$ ohm·cm may comprise two or more embodiments disclosed herein.

Hydrophobic-Treated Fumed Silica

Fumed silica is a type of synthetic amorphous silica. Synthetic amorphous silica (SAS) is a form of silicon dioxide ($SiO_2$) that is intentionally manufactured, thereby differentiating it from naturally occurring amorphous silica, e.g., diatomaceous earth. As a manmade product, SAS is nearly 100% pure amorphous silica whereas naturally occurring amorphous silica also contains crystalline forms of silica. SAS can be made into two forms that are characterized by two distinct manufacturing practices: (1) wet process silica (which includes precipitated silica and silica gel), and (2) thermal process silica (which includes pyrogenic silica, also known as fumed silica). Fumed silica is therefore SAS formed by a thermal process, as opposed to a wet process.

The thermal process for manufacturing fumed silica uses flame pyrolysis. Specifically, fumed silica is made from flame pyrolysis of silicon tetrachloride or from quartz sand vaporized in a 3000° C. electric arc. The exposure of microscopic droplets of amorphous silica to the electric arc causes the droplets to fuse into branched, chainlike, three-dimensional particles which then further agglomerate into tertiary particles. As a result, fumed silica particles have a lower bulk density and a higher surface area than wet process silica particles, such as silica gels, and greater purity compared to precipitated silicas. Fumed silica particles are also non-porous, whereas wet process silica particles are porous.

As a result of the thermal process used to make fumed silica particles, fumed silica particles are by nature hydrophilic unless specifically treated. To form hydrophobic fumed silica particles, the fumed silica particles (hydrophilic) are subjected to chemical post-treatment with a hydrophobic agent. Hydrophobic agents, such as alkoxysilanes, silazanes, or siloxanes covalently bond with the oxide groups of the silicon dioxide molecules on the fumed silica particles thereby rendering the fumed silica particles hydrophobic. The term "hydrophobic-treated fumed silica," as used herein, is non-porous fumed silica in particle form, with a hydrophobic agent bonded to the particle surface by way of one or more oxygen covalent bonds. Non-limiting examples of suitable hydrophobic agents include hexamethyldisilazane (HMDS), dimethyldichlorosilane (DDS), and polydimethylsiloxane (PDMS).

In an embodiment, the hydrophobic-treated fumed silica is fumed silica comprising a hydrophobic agent selected from an alkoxysilane, a silazane, and a siloxane bonded to the particle surface by way of one or more oxygen covalent bonds.

In an embodiment, the hydrophobic-treated fumed silica is fumed silica comprising a hydrophobic agent selected from the group consisting of hexamethyldisilazane (HMDS), dimethyldichlorosilane (DDS), and polydimethylsiloxane (PDMS) bonded to the particle surface by way of one or more oxygen covalent bonds.

In an embodiment, the hydrophobic-treated fumed silica has a specific surface area (BET) of less than 400 $m^2/g$. In an embodiment, the hydrophobic-treated fumed silica has a specific surface area (BET) from 120 $m^2/g$, or 130 $m^2/g$, or 140 $m^2/g$, or 150 $m^2/g$, or 175 $m^2/g$ to 190 $m^2/g$, or 200 $m^2/g$, or 210 $m^2/g$, or 220 $m^2/g$, or 230 $m^2/g$, or 250 $m^2/g$, or 275 $m^2/g$, or 300 $m^2/g$, or less than 350 $m^2/g$, or less than 400 $m^2/g$.

Non-limiting examples of commercially available hydrophobic-treated fumed silica include AEROSIL® R 974 which is fumed silica comprising dimethyldichlorosilane bonded to the particle surface and AEROSIL® R 812 S which is fumed silica comprising hexamethyldisilazane bonded to the particle surface, both available from Evonik Industries.

The hydrophobic-treated fumed silica may comprise two or more embodiments disclosed herein.

Alkoxysilane

The alkoxysilane is a silane compound containing at least one alkoxy group. Non-limiting examples of suitable alkoxysilanes include γ-chloropropyl trimethoxysilane, vinyl trimethoxysilane, vinyl triethoxysilane, vinyl-tris-(β-methoxy)silane, γ-methacryloxypropyl trimethoxysilane, β-(3,4-ethoxy-cyclohexyl)ethyl trimethoxysilane, vinyl triacetoxysilane, γ-(meth)acryloxy, propyl trimethoxysilane γ-glycidoxypropyl trimethoxysilane, γ-mercaptopropylt-rimethoxysilane, γ-aminopropyl trimethoxysilane, N-β-(aminoethyl)-γ-aminopropyl trimethoxysilane, and 3-(trimethoxysilyl)propylmethacrylate.

In an embodiment, the alkoxysilane is selected from vinyl trimethoxysilane, 3-(trimethoxysilyl)propylmethacrylate, or combinations thereof. In an embodiment, the silane compound is 3-(trimethoxysilyl)propylmethacrylate.

Organic Peroxide

Non-limiting examples of suitable organic peroxides include dicumyl peroxide, lauryl peroxide, benzoyl peroxide, tertiary butyl perbenzoate, di(tertiary-butyl) peroxide, cumene hydroperoxide, 2,5-dimethyl-2,5-di(t-butyl-peroxy) hexyne-3, 2,-5-di-methyl-2,5-di(t-butyl-peroxy)hexane, tertiary butyl hydroperoxide, isopropyl percarbonate, alpha, alpha'-bis(tertiary-butylperoxy)diisopropylbenzene, t-butylperoxy-2-ethylhexyl-monocarbonate, 1,1-bis(t-butylperoxy)-3,5,5-trimethyl cyclohexane, 2,5-dimethyl-2,5-dihydroxyperoxide, t-butylcumylperoxide, alpha,alpha'-bis(t-butylperoxy)-p-diisopropyl benzene, and the like.

Non-limiting examples of suitable commercially available organic peroxides include TRIGONOX® from AkzoNobel and LUPEROX® TBEC from ARKEMA.

Crosslinking Co-Agent

The co-agent can be any one, or a mixture, of co-agents, including, but not limited to, an ester, ether, ketone, cyanurate, isocyanurate, phosphate, ortho formate, aliphatic or aromatic ether containing at least 2, and preferably 3, unsaturated groups such as allyl, vinyl or acrylate. The number of carbon atoms in the co-agent can be in the range of 9 to 40 or more, and is preferably 9 to 20.

Specific examples of co-agents include, but are not limited to, triallyl cyanurate (TAC); triallyl-1,3,5-triazine-2,4, 6(1H,3H,5H)-trione also known as triallyl isocyanturate (TAIC); hexaallyl melamine; triallyl phosphate (TAP); triallyl ortho formate; tetra-allyloxy-ethane; triallyl benzene-1,3,5-tricarboxylate; diallyl phthalate; zinc dimethacrylate; ethoxylated bisphenol A dimethacrylate; methacrylate terminated monomer with average chain length of C14 or C15; pentaerythritol tetraacrylate; depentaerythritol pentaacrylate; pentaerythritol triacrylate; dimethylolpropane tetraacrylate; ethoxylated trimethylolpropane triacrylate; trimethylolpropane triacrylate; 2,4,6-triallyl-1,3,5-trione; 2,4-diphentyl-4-methyl-1-pentene; triallyl trimellitate (TATM); 3,9-divinyl-2,4,8,10-tetra-oxaspiro[5.5]undecane (DVS); and alpha-methyl styrene dimer (AMSD), as well as the other co-agents described in U.S. Pat. Nos. 5,346,961 and 4,018,852.

In an embodiment, the one or more co-agents is one or more of AMSD, TAP, TAC and TAIC.

Other Additives

The composition may contain one or more additives in addition to the hydrophobic-treated fumed silica. Non-limiting examples of suitable additives include other polymers, UV stabilizers and/or absorbers, antioxidants, scorch inhibitors, anti-slip agents, anti-block agents, pigments, fillers, and combinations thereof. These additives may be provided in known quantities, and, in some embodiments, may be added in the form of a master batch, that is pre-blended in an amount of polymer composition.

In an embodiment, the composition includes a UV stabilizer. Non-limiting examples of suitable UV stabilizers include hindered phenols, phophites, hindered amine light stabilizers (HALS), UV absorbers, hindered benzoates, and combinations of these. In an embodiment, the HALS and hindered benzoates include, but are not limited to, UV 531 available from TCI; Cynergy A400, A430 and R350; Cyasorb UV-3529; Cyasorb UV-3346; Cyasorb UV-3583; Hostavin N30; Univil 4050; Univin 5050; Chimassorb UV-119; Chimassorb 944 LD; Tinuvin 622 LD and the like. In an embodiment, the UV absorbers include benzophenones, benzotriazoles, triazines, and combinations of these, such as Tinuvin 328 or Cyasorb UV-1164.

In an embodiment, the composition includes one or more other additives selected from processing stabilizers, antioxidants, anti-slips, pigments and fillers. In an embodiment, the antioxidant is selected from the group consisting of T770 available from TCI; Cyanox 2777; Irganox 1010; Irganox 1076; Irganox B215; Irganox B225; PEPQ; Weston 399; TNPP; Irgafos 168; and Devoerphos 9228.

Pelletized Polymer Composition

The present disclosure provides a pelletized polymer composition composed of (A) an olefin-based polymer having a volume resistivity greater than $5.0*10^{15}$ ohm·cm and (B) a hydrophobic-treated fumed silica. The pelletized polymer composition is formed by melt blending (A) the olefin-based polymer having a volume resistivity greater than $5.0*10^{15}$ ohm·cm and (B) hydrophobic-treated fumed silica and pelletizing the blend.

In an embodiment, the pelletized polymer composition contains from 85 wt %, or 88 wt %, or 90 wt % to 92 wt %, or 95 wt % olefin-based polymer having a volume resistivity greater than $5.0*10^{15}$ ohm·cm and from 5 wt %, or 8 wt % to 10 wt %, or 12 wt %, or 15 wt % hydrophobic-treated fumed silica, based on the total weight of the pelletized polymer composition.

In an embodiment, the pelletized polymer composition may be referred to as a masterbatch.

The pellets of the present disclosure are used in forming a composition as described below, such as for an encapsulant film for an electronic device, e.g., photovoltaic module.

Composition

The present disclosure provides a composition comprising (A) an olefin-based polymer having a volume resistivity greater than $5.0*10^{15}$ ohm·cm, (B) a hydrophobic-treated fumed silica, (C) an alkoxysilane, (D) an organic peroxide, and, optionally, (E) a crosslinking co-agent.

In an embodiment, the composition comprises from greater than 50 wt %, or 60 wt %, or 70 wt %, or 80 wt %, or 90 wt % to 95 wt %, or 98 wt %, or 99 wt %, or less than 100 wt % of the olefin-based polymer having a volume resistivity greater than $5.0*10^{15}$ ohm·cm or blends thereof, based on the total weight of the composition. In an embodiment, the composition comprises from greater than 95.0 wt %, or 96.0 wt %, or 96.5 wt %, or 97.0 wt % to 97.5 wt %, or 98.0 wt %, or 98.5 wt % of the olefin-based polymer having a volume resistivity greater than $5.0*10^{15}$ ohm·cm or blends thereof, based on the total weight of the resin composition.

The hydrophobic-treated fumed silica is present in an amount from 0.01 wt %, or 0.05 wt %, or 0.1 wt %, or 0.5 wt % to 1.0 wt %, or 1.5 wt %, or 2.0 wt %, or 2.5 wt %, or 3.0 wt %, or 4.0 wt %, or 5.0 wt %, based on the total weight of the composition. In an embodiment, the hydrophobic-treated fumed silica is present in an amount from 0.3 wt %, or 0.5 wt %, or 0.7 wt % to 0.9 wt %, or 1.0 wt %, or 1.2 wt %, or 1.3 wt %, based on the total weight of the composition.

The alkoxysilane is present in an amount from 0.01 wt %, or 0.05 wt %, or 0.1 wt %, or 0.2 wt % to 0.3 wt %, or 0.5 wt %, or 1 wt %, or 2 wt % based on the total weight of the composition. In an embodiment, the alkoxysilane is present in an amount from 0.10 wt %, or 0.15 wt %, or 0.20 wt % to 0.25 wt %, or 0.30 wt %, or 0.35 wt %, based on the total weight of the composition.

The organic peroxide is present in the resin composition in an amount from 0.1 wt %, or 0.5 wt %, or 0.75 wt % to 1.5 wt %, or 2 wt %, or 3 wt %, or 5 wt % based on the total weight of the composition. In an embodiment, the organic peroxide is present in the resin composition in an amount from 0.8 wt %, or 0.9 wt %, or 1.0 wt % to 1.1 wt %, or 1.2 wt %, or 1.3 wt %, or 1.5 wt % based on the total weight of the composition.

The co-agent is used in amounts from 0 wt %, or greater than 0 wt % (e.g., 0.01 wt %), or 0.1 wt %, or 0.2 wt % to 0.4 wt %, or 0.5 wt %, or 1.0 wt %, or 1.1 wt %, or 1.2 wt %, or 1.3 wt %, or 1.5 wt % based on the weight of the composition. In an embodiment, the co-agent is used in amounts from 0.30 wt %, or 0.40 wt %, or 0.50 wt % to 0.60 wt %, or 0.70 wt %, or 0.80 wt %, based on the total weight of the composition.

In an embodiment, an antioxidant is used and present in an amount from greater than 0 wt %, or 0.1 wt %, or 0.2 wt % to 0.3 wt %, or 0.5 wt %, or 1.0 wt %, or 3.0 wt %, based on the total weight of the composition.

In an embodiment, a UV stabilizer is used and present in an amount from greater than 0 wt %, or 0.01 wt %, or 0.05 wt % to 0.07 wt %, or 0.10 wt %, or 0.25 wt %, or 0.50 wt %, based on the total weight of the composition.

In an embodiment, the composition contains the hydrophobic-treated fumed silica to the exclusion of all other silica, including hydrophilic fumed silica and micronized silica gel, and the composition includes, based on the total weight of the composition, (A) from 90 wt % to less than 100 wt % of an ethylene/$C_3$-$C_8$ α-olefin copolymer; (B) from 0.01 wt % to 5.0 wt % of the hydrophobic-treated fumed silica, wherein the hydrophobic-treated fumed silica includes a hydrophobic agent selected from hexamethyldisilazane, dimethyldichlorosilane, polydimethyl siloxane, and combinations thereof, the hydrophobic agent bonded to the silica particle surface by way of one or more oxygen covalent bonds; (C) from 0.01 wt % to 2 wt % of an alkoxysilane selected from vinyltrimethoxysilane, (trimethoxysilyl)propylmethacrylate, and combinations thereof; (D) from 0.1 wt % to 5.0 wt % of an organic peroxide; and (E) from greater than 0 wt % to 1.5 wt % of a crosslinking co-agent.

In an embodiment, the composition contains the hydrophobic-treated fumed silica to the exclusion of all other silica and to the exclusion of all other fillers.

In an embodiment, the composition is made by melt blending all of the components together. The (A) olefin-based polymer having a volume resistivity greater than $5.0*10^{15}$ ohm·cm and (B) hydrophobic-treated fumed silica are provided as a pelletized polymer composition (or masterbatch), combined with additional pellets of olefin-based polymer having a volume resistivity greater than $5.0*10^{15}$ ohm·cm in the appropriate ratio so as to yield the final concentration of hydrophobic-treated fumed silica, and then soaked in a mixture of the remaining constituents of the composition, i.e., alkoxysilane, organic peroxide and, optionally, crosslinking co-agent, antioxidant and/or UV stabilizer.

Film Layer

The present disclosure provides a film layer for an electronic device. The film layer is made from a composition composed of (A) an olefin-based polymer having a volume resistivity greater than $5.0*10^{15}$ ohm·cm, (B) a hydrophobic-treated fumed silica, (C) an alkoxysilane, (D) an organic peroxide, and, optionally, (E) a crosslinking co-agent, such as disclosed herein.

The film layer is made by extruding the composition. Film layers made of the composition of this disclosure may be prepared using various types of extruders, i.e., single or twin screw types. A typical extruder has a hopper at its upstream end and a die at its downstream end. Generally, the composition is provided in the form of pelletized polymer composition which has been soaked in the necessary components. The soaked pellets are fed to the hopper, and then melted and extruded at a temperature from 85° C., or 90° C., or 95° C., or 100° C. to 105° C., or 110° C., or 115° C. In an embodiment, the rotor speed is from 20 rpm, or 25 rpm, or 30 rpm to 35 rpm, or 40 rpm.

Melting and extruding the composition at a temperature generally less than 120° C. does not initiate crosslinking, curing or other reaction of the alkoxysilane. Particularly, melting and extruding the composition at a temperature less than 120° C. does not activate the peroxide and thereby does not initiate crosslinking. It is desirable to avoid or limit crosslinking until lamination. Premature crosslinking and/or premature decomposition of the organic peroxide can result in the film layer having decreased glass adhesion. In other words, the film layer remains reactive until lamination, at which point crosslinking is initiated and the composition of the film layer becomes a reaction product comprising (A) an olefin-based polymer having a volume resistivity greater than $5.0*10^{15}$ ohm·cm, (B) a hydrophobic-treated fumed silica, (C) an alkoxysilane, little if any residual (D) organic peroxide, and, optionally, (E) a crosslinking co-agent.

In an embodiment, the film layer is a monolayer structure and has a thickness from 100 μm, or 150 μm, or 200 μm, or 250 μm, or 300 μm, or 350 μm, or 400 μm to 450 μm, or 500 μm, or 550 μm, or 600 μm, or 650 μm, or 700 μm, or 800 μm.

The film layer is composed of a composition comprising from greater than 50 wt %, or 60 wt %, or 70 wt %, or 80 wt %, or 90 wt % to 95 wt %, or 98 wt %, or 99 wt %, or less than 100 wt % of the olefin-based polymer having a volume resistivity greater than $5.0*10^{15}$ ohm·cm or blends thereof, based on the total weight of the film layer. In an embodiment, the film layer is composed of a composition comprising from greater than 95.0 wt %, or 96.0 wt %, or 96.5 wt %, or 97.0 wt % to 97.5 wt %, or 98.0 wt %, or 98.5 wt % of the ethylene/$C_3$-$C_8$ α-olefin copolymer having a volume resistivity greater than $5.0*10^{15}$ ohm·cm or blends thereof, based on the total weight of the film layer.

The hydrophobic-treated fumed silica is present in an amount from 0.01 wt %, or 0.05 wt %, or 0.1 wt %, or 0.5 wt % to 1.0 wt %, or 1.5 wt %, or 2.0 wt %, or 2.5 wt %, or 3.0 wt %, or 4.0 wt %, or 5.0 wt %, based on the total weight of the film layer. In an embodiment, the hydrophobic-treated fumed silica is present in an amount from 0.3 wt %, or 0.5 wt %, or 0.7 7.0 wt % to 0.9 wt %, or 1.0 wt %, or 1.2 wt %, or 1.3 wt %, based on the total weight of the film layer.

The alkoxysilane is present in an amount from 0.01 wt %, or 0.05 wt %, or 0.1 wt %, or 0.2 wt % to 0.3 wt %, or 0.5 wt %, or 1 wt %, or 2 wt % based on the total weight of the film layer. In an embodiment, the alkoxysilane is present in an amount from 0.10 wt %, or 0.15 wt %, or 0.20 wt % to 0.25 wt %, or 0.30 wt %, or 0.35 wt %, based on the total weight of the film layer.

The organic peroxide is present in the film layer in an amount from 0.1 wt %, or 0.5 wt %, or 0.75 wt % to 1.5 wt %, or 2 wt %, or 3 wt %, or 5 wt % based on the total weight of the film layer. In an embodiment, the organic peroxide is present in the film layer in an amount from 0.8 wt %, or 0.9 wt %, or 1.0 wt % to 1.1 wt %, or 1.2 wt %, or 1.3 wt %, or 1.5 wt % based on the total weight of the film layer.

The co-agent is used in amounts from 0 wt %, or greater than 0 wt % (e.g., 0.01 wt %), or 0.1 wt %, or 0.2 wt % to 0.4 wt %, or 0.5 wt %, or 1.0 wt %, or 1.1 wt %, or 1.2 wt %, or 1.3 wt %, or 1.5 wt % based on the weight of the film layer. In an embodiment, the co-agent is used in amounts from 0.30 wt %, or 0.40 wt %, or 0.50 wt % to 0.60 wt %, or 0.70 wt %, or 0.80 wt %, based on the total weight of the film layer.

In an embodiment, an antioxidant is used and present in an amount from greater than 0 wt %, or 0.1 wt %, or 0.2 wt % to 0.3 wt %, or 0.5 wt %, or 1.0 wt %, or 3.0 wt %, based on the total weight of the film layer.

In an embodiment, a UV stabilizer is used and present in an amount from greater than 0 wt %, or 0.01 wt %, or 0.05 wt % to 0.07 wt %, or 0.10 wt %, or 0.25 wt %, or 0.50 wt %, based on the total weight of the film layer.

In an embodiment, the film layer contains the hydrophobic-treated fumed silica to the exclusion of all other silica, including hydrophilic fumed silica and micronized silica gel, and the film layer includes, based on the total weight of the film layer, (A) from 90 wt % to less than 100 wt % of an ethylene/$C_3$-$C_8$ α-olefin copolymer; (B) from 0.01 wt % to 5.0 wt % of the hydrophobic-treated fumed silica, wherein the hydrophobic-treated fumed silica comprising a hydrophobic agent selected from hexamethyldisilazane, dimethyldichlorosilane, polydimethyl siloxane, and combinations thereof, the hydrophobic agent bonded to the silica particle surface by way of one or more oxygen covalent bonds; (C) from 0.01 wt % to 2 wt % of an alkoxysilane selected from vinyltrimethoxysilane, (trimethoxysilyl)propylmethacrylate, and combinations thereof; (D) from 0.1 wt % to 5.0 wt % of an organic peroxide; and (E) from greater than 0 wt % to 1.5 wt % of a crosslinking co-agent.

In an embodiment, the film layer contains the hydrophobic-treated fumed silica to the exclusion of all other silicas and all other fillers.

In an embodiment, the film layer has a volume resistivity greater than or equal to $2.0*10^{17}$ ohm·cm, or greater than or equal to $5.0*10^{17}$ ohm·cm, or greater than or equal to $8.0*10^{17}$ ohm·cm. In an embodiment, the film layer has a volume resistivity from greater than or equal to $2.0*10^{17}$ ohm·cm, or greater than or equal to $5.0*10^{17}$ ohm·cm, or greater than or equal to $8.0*10^{7}$ ohm·cm, or $1.0*10^{18}$ ohm·cm, or $1.2*10^{18}$ ohm·cm, or $1.4*10^{18}$ ohm·cm, or $1.8*10^{18}$ ohm·cm, or $2.0*10^{18}$ ohm·cm to $2.5*10^{18}$ ohm·cm, or $3.0*10^{18}$ ohm·cm, or $3.5*10^{18}$ ohm·cm, or $4.0*10^{18}$ ohm·cm, or $4.5*10^{18}$ ohm·cm, or $5.0*10^{18}$ ohm·cm, or $5.5*10^{18}$ ohm·cm, or $6.0*10^{18}$ ohm·cm.

In an embodiment, the film layer has a mean transmittance greater than or equal to 89.00%. In an embodiment, the film layer has a mean transmittance from greater than or equal to 89.00%, or 90.00%, or 90.50%, or 90.75%, or 90.80%, or 90.85% to 90.90%, or 90.92%, or 90.94%, or 90.95%, or 91.00%, or 91.50%, or 91.75%, or 92.00%.

Film Layer 1:

In an embodiment, a film layer is composed of a composition comprising, based on the total weight of the film layer, (A) from 90 wt % to 95 wt %, or 98 wt %, or 99 wt %, or less than 100 wt % an olefin-based polymer having a volume resistivity greater than $5.0*10^{15}$ ohm·cm, (B) from 0.01 wt %, or 0.05 wt %, or 0.1 wt %, or 0.5 wt % to 1.0 wt %, or 1.5 wt %, or 2.0 wt %, or 2.5 wt %, or 3.0 wt %, or 4.0 wt %, or 5.0 wt % of a hydrophobic-treated fumed silica, (C) from 0.10 wt %, or 0.15 wt %, or 0.20 wt % to 0.25 wt %, or 0.30 wt %, or 0.35 wt % of an alkoxysilane, (D) from 0.8 wt %, or 0.9 wt %, or 1.0 wt % to 1.1 wt %, or 1.2 wt %, or 1.3 wt %, or 1.5 wt % of an organic peroxide, and (E) from 0.00 wt %, or 0.1 wt %, or 0.30 wt %, or 0.40 wt %, or 0.50 wt % to 0.60 wt %, or 0.70 wt %, or 0.80 wt % of a crosslinking co-agent.

Film Layer 2:

In an embodiment, a film layer is composed of a composition comprising, based on the total weight of the film layer, (A) from 90 wt % to 95 wt %, or 98 wt %, or 99 wt %, or less than 100 wt % of an ethylene/$C_3$-$C_8$ α-olefin copolymer having a volume resistivity greater than $5.0*10^{15}$ ohm·cm, (B) from 0.01 wt %, or 0.05 wt %, or 0.1 wt %, or 0.5 wt % to 1.0 wt %, or 1.5 wt %, or 2.0 wt %, or 2.5 wt %, or 3.0 wt %, or 4.0 wt %, or 5.0 wt % of a hydrophobic-treated fumed silica, (C) from 0.10 wt %, or 0.15 wt %, or 0.20 wt % to 0.25 wt %, or 0.30 wt %, or 0.35 wt % of an alkoxysilane, (D) from 0.8 wt %, or 0.9 wt %, or 1.0 wt % to 1.1 wt %, or 1.2 wt %, or 1.3 wt %, or 1.5 wt % of an organic peroxide, and (E) from 0.00 wt %, or 0.10 wt %, or 0.30 wt %, or 0.40 wt %, or 0.50 wt % to 0.60 wt %, or 0.70 wt %, or 0.80 wt % of a crosslinking co-agent.

Film Layer 3:

In an embodiment, a film layer is composed of a composition comprising, based on the total weight of the film layer, (A) from 90 wt % to 95 wt %, or 98 wt %, or 99 wt %, or less than 100 wt % of an ethylene/$C_3$-$C_8$ α-olefin copolymer having a volume resistivity greater than $5.0*10^{15}$ ohm·cm, (B) from 0.3 wt %, or 0.5 wt %, or 0.7 wt % to 0.9 wt %, or 1.0 wt %, or 1.2 wt %, or 1.3 wt % of a hydrophobic-treated fumed silica, (C) from 0.10 wt %, or 0.15 wt %, or 0.20 wt % to 0.25 wt %, or 0.30 wt %, or 0.35 wt % of an alkoxysilane, (D) from 0.8 wt %, or 0.9 wt %, or 1.0 wt % to 1.1 wt %, or 1.2 wt %, or 1.3 wt %, or 1.5 wt % of an organic peroxide, and (E) from 0.30 wt %, or 0.40 wt %, or 0.50 wt % to 0.60 wt %, or 0.70 wt %, or 0.80 wt % of a crosslinking co-agent.

Film Layer 4:

In an embodiment, a film layer is composed of a composition comprising, based on the total weight of the film layer, (A) from greater than 95.0 wt %, or 96.0 wt %, or 96.5 wt %, or 97.0 wt % to 97.5 wt %, or 98.0 wt %, or 98.5 wt % of an ethylene/$C_3$-$C_8$ α-olefin random copolymer having a volume resistivity greater than $5.0*10^{15}$ ohm·cm, (B) from 0.3 wt %, or 0.5 wt %, or 0.7 wt % to 0.9 wt %, or 1.0 wt %, or 1.2 wt %, or 1.3 wt % of a fumed silica comprising a hydrophobic agent selected from hexamethyldisilazane, dimethyldichlorosilane, and polydimethylsiloxane bonded to the particle surface by way of one or more oxygen covalent bonds, (C) from 0.10 wt %, or 0.15 wt %, or 0.20 wt % to 0.25 wt %, or 0.30 wt %, or 0.35 wt % of an alkoxysilane selected from vinyltrimethoxysilane, (trimethoxysilyl) propylmethacrylate, and combinations thereof, (D) from 0.8 wt %, or 0.9 wt %, or 1.0 wt % to 1.1 wt %, or 1.2 wt %, or 1.3 wt %, or 1.5 wt % of an organic peroxide, and (E) from 0.30 wt %, or 0.40 wt %, or 0.50 wt % to 0.60 wt %, or 0.70 wt %, or 0.80 wt % of a crosslinking co-agent.

In an embodiment, the film layer is in accordance with Film Layer 1, Film Layer 2, Film Layer 3, or Film Layer 4 and has one, some, or all three of the following properties:

(i) a volume resistivity from 8 greater than or equal to $2.0*10^{17}$ ohm·cm, or greater than or equal to $5.0*10^{17}$ ohm·cm, or greater than or equal to $8.0*10^{17}$ ohm·cm, or $1.0*10^{18}$ ohm·cm, or $1.2*10^{18}$ ohm·cm, or $1.4*10^{18}$ ohm·cm, or $1.8*10^{18}$ ohm·cm, or $2.0*10^{18}$ ohm·cm to $2.5*10^{18}$ ohm·cm, or $3.0*10^{18}$ ohm·cm, or $3.5*10^{18}$ ohm·cm, or $4.0*10^{18}$ ohm·cm, or $4.5*10^{18}$ ohm·cm, or $5.0*10^{18}$ ohm·cm, or $5.5*10^{18}$ ohm·cm, or $6.0*10^{18}$ ohm·cm; and/or (ii) a mean transmittance from greater than or equal to 89.00%, or 90.00%, or 90.50%, or 90.75%, or 90.80%, or 90.85% to 90.90%, or 90.92%, or 90.94%, or 90.95%, or 91.00%, or 91.50%, or 91.75%, or 92.00%; and/or (iii) a thickness from 100 μm, or 150 μm, or 200 μm, or 250 μm, or 300 μm, or 350 μm, or 400 μm to 450 μm, or 500 μm, or 550 μm, or 600 μm, or 650 μm, or 700 μm, or 800 μm.

In an embodiment, the film layer is in accordance with Film Layer 1, Film Layer 2, Film Layer 3, or Film Layer 4 and has one, two or all three properties (i)-(iii).

A film layer may comprise two or more embodiments described herein.

PV Module

The composition of this disclosure is used to construct an electronic device module, and particularly encapsulant film used in the construction of an electronic device module. The encapsulant film is used as one or more "skins" for the electronic device, i.e., applied to one or both face surfaces of an electronic device, e.g., as a front encapsulant film or rear encapsulant film, or as both the front encapsulant film and the rear encapsulant film, e.g., in which the electronic device is totally enclosed within the material.

A "photovoltaic module" or "PV module" is a laminated structure and includes the following layer components that are assembled into the final module structure, such as shown in FIG. 1:

1. light receiving and transmitting layer;
2. a front encapsulant film layer (transparent);
3. one or more photovoltaic cell (or "PV cell");
4. a rear encapsulant film layer; and
5. a backsheet.

In an embodiment, the light receiving and transmitting layer is glass, acrylic resin, polycarbonate, polyester or fluorine-containing resin. In an embodiment, the light receiving and transmitting layer is glass.

The number of photovoltaic cells in a given photovoltaic module will vary depending on the nature and use of the electronic device utilizing the photovoltaic module. In an embodiment, at least one photovoltaic cell is in direct contact with the front encapsulant film layer and rear encapsulant film layer.

In an embodiment, the backsheet is a polymer backsheet or a glass backsheet.

The layers (1)-(5) of the PV module with laminated structure described above are bonded through lamination. Through lamination, the top sheet is brought into direct contact with the front encapsulant film layer, and the backsheet is brought into direct contact with the rear encapsulant film layer. The photovoltaic cells are secured between, and in direct contact with, the front encapsulant film layer and the rear encapsulant film layer. As a result, portions of the front encapsulant film and the rear encapsulant film are in direct contact with each other.

In an embodiment, the present disclosure provides a PV module. The PV module includes a film layer of the present disclosure. The film layer of the present disclosure can be a front encapsulant film layer, a rear encapsulant film layer, a backsheet film layer, and combinations thereof. In other embodiments, the present film layer can be the entire film, or are or more discrete sublayers of a film.

In an embodiment, the film layer is a front encapsulant film layer. The front encapsulant film layer is in direct contact with the photovoltaic cell. In a further embodiment, the front encapsulant film layer is a monolayer structure and has a thickness from 100 µm, or 150 µm, or 200 µm, or 250 µm, or 300 µm, or 350 µm, or 400 µm to 450 µm, or 500 µm, or 550 µm, or 600 µm, or 650 µm, or 700 µm, or 800 µm.

In an embodiment, the film layer is a rear encapsulant film layer. The rear encapsulant film layer is in direct contact with the photovoltaic cell. In a further embodiment, the rear encapsulant film layer is a monolayer structure and has a thickness from 100 µm, or 150 µm, or 200 µm, or 250 µm, or 300 µm, or 350 µm, or 400 µm to 450 µm, or 500 µm, or 550 µm, or 600 µm, or 650 µm, or 700 µm, or 800 µm.

In an embodiment, both the front encapsulant film layer and the rear encapsulant film layer are film layers as disclosed herein. Each of the front encapsulant film layer and the rear encapsulant film layer directly contact the photovoltaic cell. A portion of the front encapsulant film layer also directly contacts a portion of the rear encapsulant film layer. The front encapsulant film layer and the rear encapsulant film layer can be as previously described.

In an embodiment, the film layer(s) comprising the compositions of this disclosure are applied to an electronic device by one or more lamination techniques. Through lamination, the cover sheet is brought in direct contact with a first facial surface of the encapsulant film layer, and the electronic device is brought in direct contact with a second facial surface of the encapsulant film layer. In another embodiment, the cover sheet is brought into direct contact with a first facial surface of the front encapsulant film layer, the back sheet is brought in direct contact with a second facial surface of the rear encapsulant film layer, and the electronic device(s) is secured between, and in direct contact with the second facial surface of the front encapsulant film layer and the first facial surface of the rear encapsulant film layer.

In an embodiment, the lamination temperature is sufficient to activate the organic peroxide and crosslink the composition, that is, the composition comprising (A) an olefin-based polymer having a volume resistivity greater than $5.0*10^{15}$ ohm·cm, (B) a hydrophobic-treated fumed silica, (C) an alkoxysilane, (D) an organic peroxide, and, optionally, (E) a crosslinking co-agent, such as disclosed herein remains reactive until lamination when crosslinking occurs. The alkoxysilane also interacts with the surface of the cover sheet to increase adhesion between the encapsulant film layer and the cover sheet. After lamination, the composition is a reaction product of the composition comprising (A) an olefin-based polymer having a volume resistivity greater than $5.0*10^{15}$ ohm·cm, (B) a hydrophobic-treated fumed silica, (C) an alkoxysilane, (D) an organic peroxide, and, optionally, (E) a crosslinking co-agent. That is, upon lamination, at least a portion of the peroxide is consumed and the olefin-based polymer is crosslinked by reaction with the alkoxysilane. Therefore, the term "encapsulant film layer," as used herein, refers to the film layer of the electronic device after lamination and which is a silane-crosslinked film layer.

In an embodiment, the lamination temperature for producing an electronic device is from 130° C., or 135° C., or 140° C., or 145° C. to 150° C., or 155° C., or 160° C. In an embodiment, the lamination time is from 8 minutes, or 10 minutes, or 12 minutes, or 15 minutes to 18 minutes, or 20 minutes, or 22 minutes, or 25 minutes.

In an embodiment, the electronic device of the present disclosure includes an encapsulant film layer having a glass adhesion from greater than 100 N/cm, or greater than 110 N/cm, or greater than 120 N/cm to 130 N/cm, or 140 N/cm, or 150 N/cm, or 160 N/cm.

In an embodiment, the electronic device of the present disclosure includes an encapsulant film layer having a maximum torque (MH) greater than 3.1 dNm. In an embodiment, the electronic device of the present disclosure includes an encapsulant film layer having a maximum torque (MH) from greater than 3.10 dNm, or 3.15 dNm to 3.20 dNm, or 3.25 dNm, or 3.50 dNm.

In an embodiment, the electronic device of the present disclosure includes an encapsulant film layer having a t90 less than 13.000 minutes. In an embodiment, the electronic device of the present disclosure includes an encapsulant film layer having a t90 from less than 13.000 min, or less than 12.500 min, or less than 12.100 min, or less than 12.050 min, or less than 12.000 min, or less than 11.750 min, or less than 11.500 min, or less than 11.400 min, or less than 11.300 min, or less than 11.250 min, or less than 11.200 min to 11.150 min, or 11.100 min, or 11.050 min, or 11.010 min, or 11.000 min.

In an embodiment, the electronic device of the present disclosure includes an encapsulant film layer having a volume resistivity greater than or equal to $2.0*10^{17}$ ohm·cm, or greater than or equal to $5.0*10^{17}$ ohm·cm, or greater than or equal to $8.0*10^{17}$ ohm·cm. In an embodiment, the electronic device of the present disclosure includes an encapsulant film layer having a volume resistivity from greater than or equal to $2.0*10^{17}$ ohm·cm, or greater than or equal to $5.0*10^{17}$ ohm·cm, or greater than or equal to $8.0*10^{17}$ ohm·cm, or $1.0*10^{18}$ ohm·cm, or $1.2*10^{18}$ ohm·cm, or $1.4*10^{18}$ ohm·cm, or $1.8*10^{18}$ ohm·cm, or $2.0*10^{18}$ ohm·cm to $2.5*10^{18}$ ohm·cm, or $3.0*10^{18}$ ohm·cm, or $3.5*10^{18}$ ohm·cm, or $4.0*10^{18}$ ohm·cm, or $4.5*10^{18}$ ohm·cm, or $5.0*10^{18}$ ohm·cm, or $5.5*10^{18}$ ohm·cm, or $6.0*10^{18}$ ohm·cm.

In an embodiment, the electronic device of the present disclosure includes an encapsulant film having a mean transmittance greater than or equal to 89.00%. In an embodiment the electronic device of the present disclosure includes an encapsulant film having a mean transmittance from greater than or equal to 89.00%, or 90.00%, or 90.50%, or 90.75%, or 90.80%, or 90.85% to 90.90%, or 90.92%, or 90.94%, or 90.95%, or 91.00%, or 91.50%, or 91.75%, or 92.00%.

In an embodiment, the electronic device of the present disclosure includes an encapsulant film layer which is a monolayer structure having a thickness from 100 µm, or 150 µm, or 200 µm, or 250 µm, or 300 µm, or 350 µm, or 400 µm to 450 µm, or 500 µm, or 550 µm, or 600 µm, or 650 µm, or 700 µm, or 800 µm.

In an embodiment, a film layer in accordance with Film Layer 1, Film Layer 2, Film Layer 3 or Film Layer 4 is used in forming an electronic device. The resulting electronic device therefore includes an encapsulant film layer Encapsulant Film Layer 1, Encapsulant Film Layer 2, Encapsulant Film Layer 3, or Encapsulant Film Layer 4 which is the silane-crosslinked lamination product of Film Layer 1, Film Layer 2, Film Layer 3 or Film Layer 4, respectively.

In an embodiment, the electronic devices of the present disclosure include an encapsulant film layer according to Encapsulant Film Layer 1, Encapsulant Film Layer 2, Encapsulant Film Layer 3 or Encapsulant Film Layer 4 having one, some or all of the following properties:
(i) a glass adhesion from greater than 100 N/cm, or greater than 110 N/cm, or greater than 120 N/cm to 130 N/cm, or 140 N/cm, or 150 N/cm, or 160 N/cm; and/or (ii) a MH from greater than 3.10 dNm, or 3.15 dNm to 3.20 dNm, or 3.25 dNm, or 3.50 dN; and/or (iii) a t90 from less than 13.000 min, or less than 12.500 min, or less than 12.100 min, or less than 12.050 min, or less than 12.000 min, or less than 11.750 min, or less than 11.500 min, or 11.400 min, or 11.300 min, or 11.250 min, or 11.200 min to 11.150 min, or 11.100 min, or 11.050 min, or 11.010 min, or 11.000 min; and/or (iv) a volume resistivity from greater than or equal to $2.0*10^{17}$ ohm·cm, or greater than or equal to $5.0*10^{17}$ ohm·cm, or greater than or equal to $8.0*10^{17}$ ohm·cm, or $1.0*10^{18}$ ohm·cm, or $1.2*10^{18}$ ohm·cm, or $1.4*10^{18}$ ohm·cm, or $1.8*10^{18}$ ohm·cm, or $2.0*10^{18}$ ohm·cm to $2.5*10^{18}$ ohm·cm, or $3.0*10^{18}$ ohm·cm, or $3.5*10^{18}$ ohm·cm, or $4.0*10^{18}$ ohm·cm, or $4.5*10^{18}$ ohm·cm, or $5.0*10^{18}$ ohm·cm, or $5.5*10^{18}$ ohm·cm, or $6.0*10^{18}$ ohm·cm; and/or (v) a mean transmittance from greater than or equal to 89.00%, or 90.00%, or 90.50%, or 90.75%, or 90.80%, or 90.85% to 90.90%, or 90.92%, or 90.94%, or 90.95%, or 91.00%, or 91.50%, or 91.75%, or 92.00%; and/or (vi) a thickness from 100 μm, or 150 μm, or 200 μm, or 250 μm, or 300 μm, or 350 μm, or 400 μm to 450 μm, or 500 μm, or 550 μm, or 600 μm, or 650 μm, or 700 μm, or 800 μm.

In an embodiment, the electronic device of the present disclosure includes an encapsulant film layer according to Encapsulant Film Layer 1, Encapsulant Film Layer 2, Encapsulant Film Layer 3, or Encapsulant Film Layer 4 having at least 2, at least 3, at least 4, at least 5, or all 6 if properties (i)-(vi).

Some embodiments of the present disclosure will now be described in detail in the following examples.

EXAMPLES

Materials

TABLE 1

Materials Used and Properties

| Material | Properties |
|---|---|
| Ethylene/octene copolymer ("EO1")** | Density = 0.880 g/cc<br>MI = 18.0 g/10 min<br>Tm = 76° C.<br>VR = $1.0 * 10^{15}$ ohm.cm<br>2% secant = 20.5 MPa |
| Ethylene/octene copolymer ("EO2") | Density = 0.880 g/cc<br>MI =18.0 g/10 min<br>Tm = 76° C.<br>Volume Resistivity = $4.0 * 10^{16}$ ohm.cm<br>2% secant = 20.5 MPa |
| Organic Peroxide | Tert-butylperoxy 2-ethylhexyl carbonate |
| Alkoxysilane | 3-(trimethoxysilyl)propylmethacrylate |
| Crosslinking Co-agent | Triallyl isocyanurate |
| Hydrophobic-treated Fumed Silica 1 ("Hydrophobic Silica 1") | AEROSIL ® 812 S, a hydrophobic fumed silica treated with hexamethyldisilazane specific surface area (BET) = 195-245 m²/g carbon content = 3.0-4.0 wt % tapped density (according to DIN EN ISO 787/11, Aug. 1983) = 60 g/L moisture (2 hours @ 105° C.) ≤ 0.5 wt % ignition loss (2 hours @ 1000° C. based on material dried for 2 hours @ 105° C.) ≤ 2.0 wt % pH in 4% dispersion = 3.7-4.7<br>SiO₂ content based on ignited material ≥ 99.8 wt % |

TABLE 1-continued

Materials Used and Properties

| Material | Properties |
|---|---|
| Hydrophobic-treated Fumed Silica 2 ("Hydrophobic Silica 2") | AEROSIL ® 974, a hydrophobic fumed silica treated with dimethyldichlorosilane specific surface area (BET) = 150-190 m²/g carbon content = 0.7-1.3 wt % tapped density (according to DIN EN ISO 787/11, Aug. 1983) = 50 g/L moisture (2 hours @ 105° C.) ≤ 0.5 wt % ignition loss (2 hours @ 1000° C. based on material dried for 2 hours @ 105° C.) ≤ 2.0 wt % pH in 4% dispersion = 3.7-4.7<br>SiO₂ content based on ignited material ≥ 99.8 wt % |
| UV Stabilizer | 2-hydroxy-4-n-octoloxybenzophenone (available as UV 531 from TCI) |
| Antioxidant | Bis(2,2,6,6-tetramethyl-4-piperidyl) Sebacate (available as T 770 from TCI) |

Sample Preparation

Ethylene/octene copolymer pellets are fed into a Brabender mixer at a temperature of 130° C. with a rotor speed of 10 rpm. The various fumed silicas are then added in accordance with the formulations provided in Table 2, below. The final mixing is conducted at 130° C. and a rotor speed of 80 rpm for 5 minutes. The resulting compound is collected and cut into small pieces.

The small pieces of ethylene/octene copolymer/silica (or, if no silica is added, just ethylene/octene copolymer) are fed into the hopper of a Brabender single extruder. The small pieces are extruded to melt strand at 110° C. with a screw speed of 25 rpm. The melt strand is fed into the Brabender pelletizer to prepare pellets.

The alkoxysilane, peroxide, co-agent, and any additional additives, such as UV stabilizer and antioxidant, are weighed and mixed in a sealable plastic bottle in accordance with Table 2, below. The pellets are weighed in accordance with Table 2 and added to the plastic bottle. To ensure a homogenous distribution, and complete soaking, the plastic bottle was first tumbled for 1 minute and then placed on a running roller for further homogenization in an oven at 40° C. for 15-20 hours before using.

Film Preparation

After soaking, the pellets are fed into a Brabender single screw mixer at 105° C. with a rotor speed of 30 rpm. Films with a thickness of approximately 0.5 mm are prepared and stored in sealed aluminum foil bags for testing.

Compression Molding

Cast films are compression molded into a 0.5 mm film. The samples are placed in a mold, preheated to 120° C. for 5 minutes, and then degassed via 8 cycles of pressure loading/releasing. The degassed samples are then pressed at 150° C. for 15 minutes and cooled to room temperature. The compression molded sheets are used for the volume resistivity and transmittance tests.

Lamination

4"×6" glass plates are cleaned using water and dried before use. The backsheets are cut into four 6-inch squares. The film samples are cut into pieces to fit the size of the glass and backsheet. The backsheet, film samples, and glass are layered together to form a backsheet/film sample/glass structure and then laminated on a PENERGY L036 laminator at 150° C. for 20 minutes (4 minutes of vacuum and 16 minutes pressing). The laminated samples are used for the glass adhesion test.

TABLE 2

Sample Formulations and Properties

| | CS1 | CS2 | CS3 | CS4 | CS5 | CS6 | IE1 | IE2 | IE3 | IE4 |
|---|---|---|---|---|---|---|---|---|---|---|
| EO1 | 100 | 98.18 | 97.18 | 96.88 | — | — | — | — | — | — |
| EO2 | — | — | — | — | 100 | 97.88 | 97.38 | 96.88 | 97.38 | 96.88 |
| Peroxide (wt %) | — | 1 | 1 | 1 | — | 1 | 1 | 1 | 1 | 1 |
| Alkoxysilane (wt %) | — | 0.25 | 0.25 | 0.25 | — | 0.25 | 0.25 | 0.25 | 0.25 | 0.25 |
| Co-agent (wt %) | — | 0.5 | 0.5 | 0.5 | — | 0.5 | 0.5 | 0.5 | 0.5 | 0.5 |
| Antioxidant (wt %) | — | 0.07 | 0.07 | 0.07 | — | 0.07 | 0.07 | 0.07 | 0.07 | 0.07 |
| UV Stabilizer (wt %) | — | — | — | 0.3 | — | 0.3 | 0.3 | 0.3 | 0.3 | 0.3 |
| Hydrophobic Silica 1 (wt %) | — | — | 1 | — | — | — | 0.5 | 1 | — | — |
| Hydrophobic Silica 2 (wt %) | — | — | — | 1 | — | — | — | — | 0.5 | 1 |
| Total (wt %) | 100 | 100 | 100 | 100 | 100 | 100 | 100 | 100 | 100 | 100 |
| Test Results | | | | | | | | | | |
| MH (dNm) | — | — | — | — | — | 2.94 | 3.18 | 3.28 | 3.17 | 3.25 |
| t90 (min) | — | — | — | — | — | 11.293 | 12.043 | 11.063 | 11.380 | 11.529 |
| Mean Transmittance, 380-1100 nm (%) | — | — | — | — | — | 91.04 | 90.94 | 90.93 | 91.00 | 90.88 |
| Average Glass Adhesion (N/cm) | — | — | — | — | — | 140.55 | 128.37 | 135.06 | 150.43 | 145.29 |
| Volume Resistivity, (ohm · cm) | $1.0*10^{15}$ | $1.1*10^{15}$ | $8.7*10^{14}$ | $2.3*10^{14}$ | $4.0*10^{16}$ | $1.8*10^{17}$ | $5.7*10^{18}$ | $1.2*10^{18}$ | $1.0*10^{18}$ | $1.4*10^{18}$ |

CS = comparative sample;
IE = inventive example

As shown by CS1-4, incorporating hydrophobic-treated fumed silica in a resin composition having a base ethylene/octene copolymer with a VR of less than $5.0*10^{15}$ worsens the VR of the composition. Comparative Sample 1 is a film layer made of a neat resin (no additives) having a VR less than $5.0*10^{15}$ ohm·cm. Comparative Sample 2 is a film layer made of the resin composition including an ethylene/octene copolymer with a VR less than $5.0*10^{15}$ ohm·cm and additives, but no silica. The inclusion of the additives other than silica has minimal effect on the VR of the composition (from $1.0*10^{15}$ ohm·cm for a composition of the neat resin in CS1 to $1.1*10^{15}$ ohm·cm for CS2). The addition of hydrophobic-treated fumed silica decreases (worsens) the VR of a resin composition having an ethylene/octene copolymer with a VR of less than $5.0*10^{15}$ ohm·cm, as shown by CS3-4. CS3 and CS4, both of which include hydrophobic-treated fumed silica in combination with a resin composition having a base polymer having a VR of less than $5.0*10^{15}$ ohm·cm, have VR values of $8.7*10^{14}$ ohm·cm and $2.3*10^{14}$ ohm·cm, respectively, as compared to CS2 which uses the same base resin and additives as CS3 and CS4, but omits the hydrophobic-treated fumed silica.

Comparative Sample 5 is a film layer made of the neat resin (no additives) having a VR greater than $5.0*10^{15}$ ohm·cm. Comparative Sample 6 is a film layer made of a resin composition having a base polymer with a VR greater than $5.0*10^{15}$ ohm·cm and including additives except silica. Applicant surprisingly discovered that the inclusion of a hydrophobic-treated fumed silica results in a significant improvement in VR in samples in which the base resin in an olefin-based polymer having a VR of greater than $5.0*10^{15}$ ohm·cm. IE1-4 each have a VR greater than $2.0*10^{17}$ ohm·cm, and further a VR greater than $8.0*10^{17}$ ohm·cm, as compared to CS3-4 which have VR values less than $2.0*10^{17}$ ohm·cm. In particular, CS5 and CS6 have VR values of $4.0*10^{15}$ ohm·cm and $1.8*10^{17}$ ohm·cm, respectively, while IE1-IE4 have VR values of $5.7*10^{18}$ ohm·cm, $1.2*10^{18}$ ohm·cm, $1.0*10^{18}$ ohm·cm, and $1.4*10^{18}$ ohm·cm, respectively.

Further, Applicant surprisingly discovered that the inclusion of hydrophobic-treated fumed silica in the film having an ethylene/octene copolymer with a VR greater than $5.0*10^{15}$ ohm·cm resulted in a film having a combination of improved VR (i.e., VR greater than $2.0*10^{17}$ ohm·cm) and desirable glass adhesion (i.e., glass adhesion greater than 100 N/cm). CS6 (cured resin, no silica) has a glass adhesion of 140.55 N/cm and poor VR ($1.8*10^{17}$ ohm·cm). The inclusion of hydrophobic-treated fumed silica had little to no impact on the glass adhesion relative to the cured resin without silica (CS6). Each of IE1-4 has a glass adhesion greater than 100 N/cm, and indeed, greater than 120 N/cm. In particular, the glass adhesion of IE1-4 ranged from 128.37 N/cm (IE1) to 150.43 N/cm (IE3).

As shown by a comparison of CS1-6 to IE1-4, the inclusion of hydrophobic-treated fumed silica in the film composed of a resin composition comprising an olefin-based polymer having a VR greater than $5.0*10^{15}$ ohm·cm resulted in a film having a combination of improved VR (i.e., VR greater than $2.0*10^{17}$ ohm·cm) and a desirable glass adhesion (i.e., glass adhesion greater than 100 N/cm).

It is specifically intended that the present invention not be limited to the embodiments and illustrations contained herein, but include modified forms of those embodiments including portions of the embodiments and combinations of elements of different embodiments as come within the scope of the following claims.

The invention claimed is:

1. A photovoltaic module comprising:
a photovoltaic cell; and
a front encapsulant film layer and a rear encapsulant film layer, the photovoltaic cell secured between the front encapsulant film layer and the rear encapsulant film layer, each encapsulant film layer comprising
(A) a silane-crosslinked olefin-based polymer, the olefin-based polymer prior to crosslinking having a volume resistivity from greater than $5.0*10^{15}$ ohm·cm to $5.0*10^{16}$ ohm·cm and consisting of (i) ethylene and (ii) $C_3$-$C_8$ α-olefin comonomer;
(B) particles of hydrophobic-treated fumed silica disposed in the silane-crosslinked olefin-based polymer, wherein each encapsulant film layer comprises the particles of hydrophobic-treated fumed silica to the exclusion of all other silicas, wherein the hydrophobic-treated fumed silica comprises a hydrophobic agent bonded to the fumed silica, and hydrophobic agent is selected from the group consisting of hexamethyldisilazane (HMDS), dimethyldichlorosilane (DDS), polydimethylsiloxane PDMS) and combinations thereof; and
wherein each film layer has a volume resistivity from greater than or equal to $5.0\text{-}8.0*10^{17}$ ohm·cm to $6.0*10^{18}$ ohm·cm.

2. The photovoltaic module of claim 1, wherein the silane-crosslinked olefin-based polymer in each encapsulant film layer comprises from 0.1 wt % to 0.35 wt % of an alkoxysilane, based on total weight of each respective encapsulant film layer.

3. The photovoltaic module of claim 2, wherein the alkoxysilane is selected from the group consisting of vinyltrimethoxysilane, (trimethoxysilyl) propylmethacrylate, and combinations thereof.

4. The photovoltaic module of claim 2, wherein each encapsulant film layer has a maximum torque greater than 3.1 dNm.

5. The photovoltaic module of claim 2, wherein each encapsulant film layer has a t90 less than 13.000 minutes.

6. The photovoltaic module of claim 2, wherein each encapsulant film layer has a mean transmittance from greater than or equal to 89.00% to 92.00%.

7. The photovoltaic module of claim 2, wherein each encapsulant film layer has a glass adhesion from greater than 120 N/cm to 160 N/cm.

8. The photovoltaic module of claim 2 wherein the front encapsulant film layer and the rear encapsulant film layer each is in direct contact with the photovoltaic cell.

9. The photovoltaic module of claim 8 wherein portions of the front encapsulant film layer and portions of the rear encapsulant film layer contact each other.

10. A photovoltaic module comprising:
a photovoltaic cell; and
a first film layer and an opposing second film layer, the photovoltaic cell secured between, and in direct contact with, the first film layer and the opposing second film layer, each film layer composed of a composition which is the reaction product of a composition comprising
(A) from 90 wt % to less than 100 wt % of an olefin-based polymer having a volume resistivity from greater than $5.0*10^{15}$ ohm·cm to $5.0*10^{16}$ ohm·cm, the olefin-based polymer consisting of (i) ethylene and (ii) $C_3$-$C_8$ α-olefin comonomer;
(B) from 0.01 wt % to 5.0 wt % of a hydrophobic-treated fumed silica, wherein the composition comprises the hydrophobic-treated fumed silica to the exclusion of all other silicas, wherein the hydrophobic-treated fumed silica comprises a hydrophobic agent bonded to the fumed silica, and hydrophobic agent is selected from the group consisting of hexamethyldisilazane (HMDS), dimethyldichlorosilane (DDS), polydimethylsiloxane (PDMS) and combinations thereof;
(C) from 0.01 wt % to 2 wt % of an alkoxysilane;
(D) from 0.1 wt % to 5.0 wt % of an organic peroxide; and
(E) from 0 wt % to 1.5 wt % of a crosslinking co-agent,
wherein each film layer has a volume resistivity from greater than or equal to $8.0*10^{17}$ ohm·cm to $6.0*10^{18}$ ohm·cm.

11. The photovoltaic module of claim 10, wherein the composition consists of, based on the total weight of the composition,
(A) from 95 wt % to 98.5 wt % of the olefin-based polymer;
(B) from 0.1 wt % to 0.5 wt % of the alkoxysilane;
(C) from 0.1 wt % to 1.5 wt % of the hydrophobic-treated fumed silica;
(D) from 0.5 wt % to 1.5 wt % of the organic peroxide; and
(E) from 0.2 to 1.0 wt % of the crosslinking co-agent;
(F) from 0 wt % to 3.0 wt % of an antioxidant; and
(G) from 0 wt % to 0.5 wt % of a UV stabilizer.

12. The photovoltaic module of claim 11, wherein the olefin-based polymer has a flexural modulus (2% secant) from less than 6000 psi to greater than or equal to 500 psi.

13. The photovoltaic module of claim 10, wherein the alkoxysilane is selected from the group consisting of vinyltrimethoxysilane, (trimethoxysilyl)propylmethacrylate, and combinations thereof.

14. The photovoltaic module of claim 13, wherein each film layer has a glass adhesion from greater than 120 N/cm to 160 N/cm.

15. The photovoltaic module of claim 14, wherein the first film layer is a front encapsulant film layer and has a mean transmittance from greater than or equal to 90.00% to 92.00%.

16. The photovoltaic module of claim 10, wherein the olefin-based polymer is an ethylene/octene copolymer.

17. The photovoltaic module of claim 10, wherein the first film layer and the opposing second film layer wholly surround the photovoltaic cell.

* * * * *